(12) United States Patent
Cook et al.

(10) Patent No.: US 6,352,594 B2
(45) Date of Patent: Mar. 5, 2002

(54) METHOD AND APPARATUS FOR IMPROVED CHEMICAL VAPOR DEPOSITION PROCESSES USING TUNABLE TEMPERATURE CONTROLLED GAS INJECTORS

(75) Inventors: Robert C. Cook; Daniel L. Brors, both of Livermore, CA (US)

(73) Assignee: Torrex, Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/229,975

(22) Filed: Jan. 14, 1999

Related U.S. Application Data

(63) Continuation-in-part of application No. 09/228,840, filed on Jan. 12, 1999, which is a continuation-in-part of application No. 08/909,461, filed on Aug. 11, 1997.
(60) Provisional application No. 60/071,571, filed on Jan. 15, 1998, and provisional application No. 60/071,570, filed on Jan. 15, 1998.

(51) Int. Cl.⁷ ............................................. C23C 16/48

(52) U.S. Cl. ..................... 118/724; 118/641; 118/725; 118/730

(58) Field of Search ............................ 118/719, 723 R, 118/728, 723 E, 724, 725; 156/345, 646.1; 204/164, 298.37; 134/1.1; 117/84, 97, 98; 438/597

(56) References Cited

U.S. PATENT DOCUMENTS

| | | | | | |
|---|---|---|---|---|---|
| 4,178,877 | A | * | 12/1979 | Kudo | 118/728 |
| 4,292,153 | A | * | 9/1981 | Kudo et al. | 204/164 |
| 4,381,965 | A | * | 5/1983 | Maher, Jr. et al. | 156/345 |
| 4,565,157 | A | * | 1/1986 | Brors et al. | 118/719 |
| 4,693,777 | A | | 9/1987 | Hazano et al. | 156/345 |
| 4,728,389 | A | * | 3/1988 | Logar | 117/97 |

FOREIGN PATENT DOCUMENTS

| | | |
|---|---|---|
| JP | 61-197638 | 9/1986 |
| JP | 03-011546 | 1/1991 |
| JP | 08-138620 | 5/1996 |

*Primary Examiner*—Gregory Mills
*Assistant Examiner*—Rudy Zervigon
(74) *Attorney, Agent, or Firm*—David H. Jaffer; Pillsbury Winthrop LLP

(57) ABSTRACT

A multiwafer chemical vapor deposition (CVD) reactor providing improved material deposition uniformity through use of improved gas injection and exhaust apparatus. The reactor includes a wafer boat for supporting a vertical stack of wafers, spaced apart for passage of a reactant gas. A preferred embodiment of the gas injector is in the form of a vertically oriented body having at a first end a gas inlet, and extending inward from a wall of the reactor towards the wafer boat, terminating in a widened injector outlet. The injector body and outlet extend vertically a distance approximating the height of the wafer boat, and the outlet is widened to provide an improved flow of gas across the wafer. A face of the injector outlet contains a plurality of gas ejecting holes, arranged to provide a uniform supply of reactant gas over each wafer surface. The exhaust manifold is similarly configured, having a plurality of exhaust ports distributed over the height of the manifold to assist in preserving the uniform flow of reactant gas across each wafer.

12 Claims, 14 Drawing Sheets

U.S. PATENT DOCUMENTS

| | | | |
|---|---|---|---|
| 4,745,088 A | * 5/1988 | Inoue et al. | 117/98 |
| 4,870,245 A | 9/1989 | Price et al. | 219/121.36 |
| 4,951,601 A | 8/1990 | Maydan et al. | 118/719 |
| 4,969,416 A | 11/1990 | Schumaker et al. | 118/725 |
| 5,067,437 A | * 11/1991 | Watanabe et al. | 118/715 |
| 5,198,071 A | * 3/1993 | Watanabe et al. | 117/84 |
| 5,203,956 A | 4/1993 | Hansen | 156/643 |
| 5,225,036 A | * 7/1993 | Watanabe et al. | 438/597 |
| 5,272,417 A | 12/1993 | Ohmi | 315/111.21 |
| 5,291,030 A | 3/1994 | Brors | 250/573 |
| 5,356,475 A | * 10/1994 | Diiorio et al. | 118/723 E |
| 5,383,984 A | * 1/1995 | Shimada et al. | 156/345 |
| 5,458,689 A | * 10/1995 | Saito | 118/724 |
| 5,458,724 A | 10/1995 | Syverson et al. | 156/345 |
| 5,493,987 A | 2/1996 | McDiarmid et al. | 117/102 |
| 5,551,985 A | 9/1996 | Brors et al. | 118/725 |
| 5,584,963 A | * 12/1996 | Takahashi | 156/646.1 |
| 5,613,821 A | * 3/1997 | Muka et al. | 414/217 |
| 5,626,678 A | 5/1997 | Sahin et al. | 118/723 E |
| 5,795,452 A | * 8/1998 | Kinoshita et al. | 204/298.37 |
| 5,844,195 A | 12/1998 | Fairbain et al. | 219/121.43 |
| 5,849,092 A | * 12/1998 | Xi et al. | 134/1.1 |
| 5,968,276 A | * 10/1999 | Lei et al. | 118/723 R |

* cited by examiner

Single Wafer Reactor With
High Speed Rotation

Cross Section A-A

Cross Section B-B

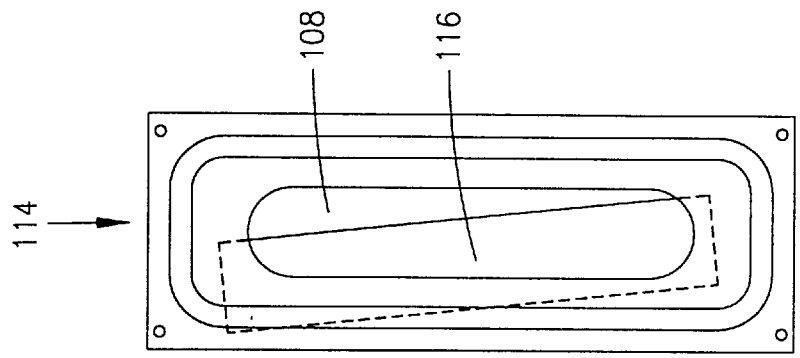
FIG. 11A  FIG. 11B
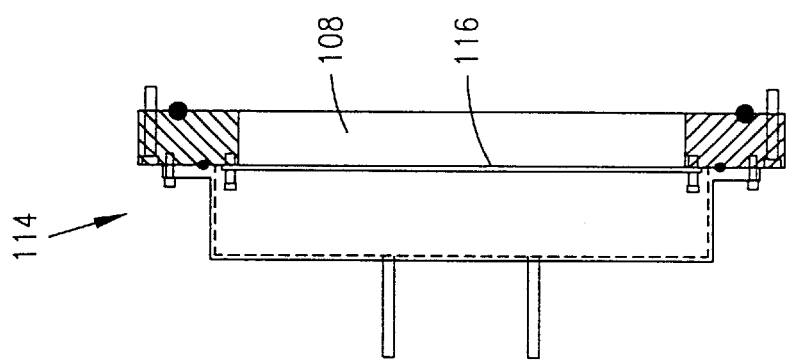
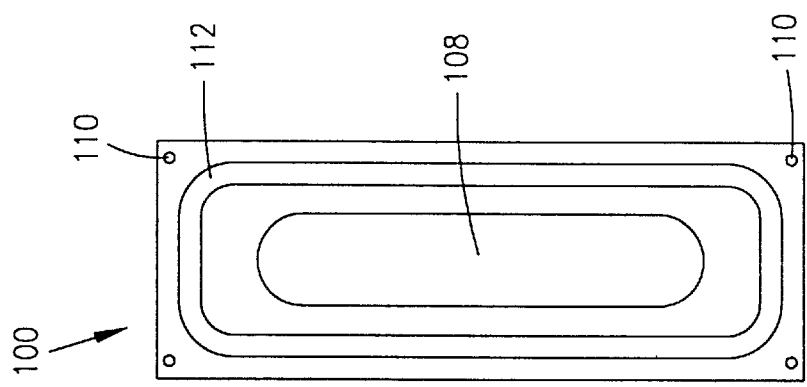
FIG. 10A  FIG. 10B
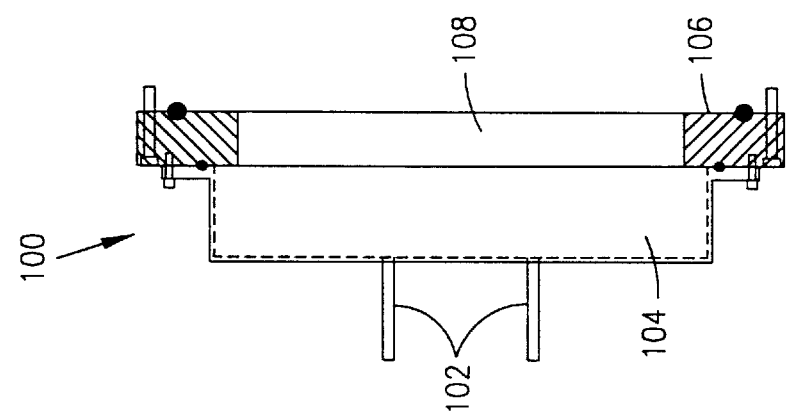

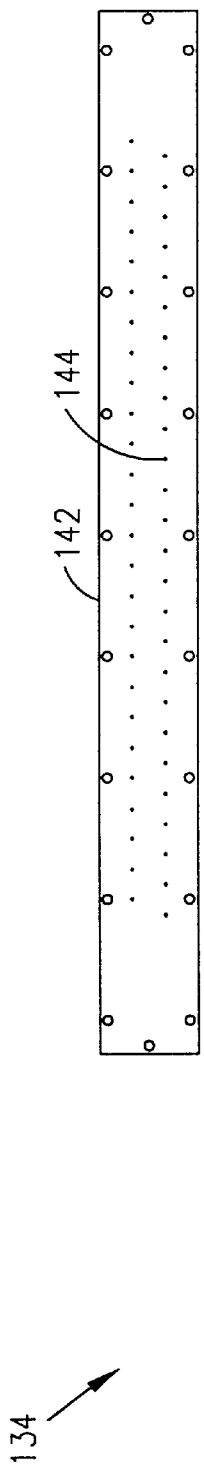
FIG. 14B
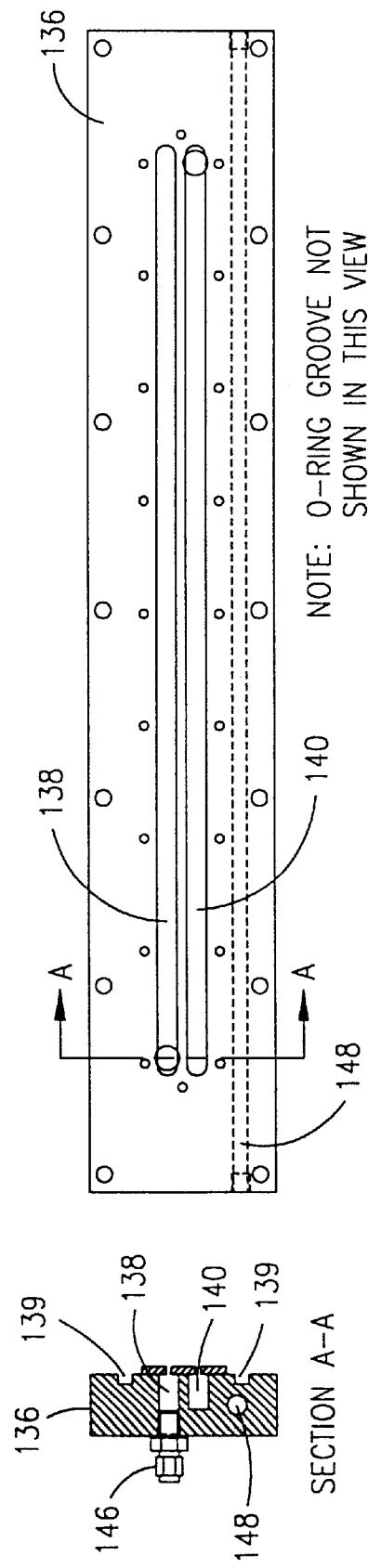
FIG. 14C
SECTION A-A
FIG. 14A

METHOD AND APPARATUS FOR IMPROVED CHEMICAL VAPOR DEPOSITION PROCESSES USING TUNABLE TEMPERATURE CONTROLLED GAS INJECTORS

This application claims the benefit of U.S. Provisional Application No. 60/071,570 filed Jan. 15, 1998 and No. 60/071,571 filed Jan. 15, 1998, and is a continuation-in-part of copending U.S. application Ser. No. 08/909,461 filed Aug. 11, 1997 and Ser. No. 09/228,840 filed Jan. 12, 1999.

BACKGROUND OF THE INVENTION

1. Field of the Invention

The present invention relates generally to chemical vapor deposition methods and apparatus, and more particularly to a CVD reactor having an improved reactant gas injection and exhaust system for achieving more rapid and uniform material deposition.

2. Brief Description of the Prior Art

There are a large number of CVD processes that are performed inside of enclosed chambers wherein the pressure, temperature, composition of gases and other factors are controlled to produce the desired thin film deposition of various materials onto substrates such as semiconductor wafers and flat panel displays. For convenience the term wafer(s) will be used with the understanding that the following would apply to the manufacture of flat panel displays and other types of substrates.

For instance, amorphous, polycrystalline and epitaxial silicon is typically deposited onto silicon wafers by injecting silane or dichlorosilane, with or without other gases, into an enclosed vessel where the temperatures, pressure, gas flow, RF plasma intensity (when used) and wafer motion (when employed) are precisely controlled. Such processes are carried out in a wide variety of commercially available hot wall and cold wall reactors. Some of these process a single wafer at a time while others process a batch of two or more wafers at a time.

To obtain the best thickness uniformity, the operating regime of the process chamber is often chosen to be completely dominated either by the chemical reaction at the wafer surface (surface reaction rate limited) or by mass transport of the reactant to the wafer surface (mass transport limited) to make the overall deposition process least sensitive to variables which are poorly controlled in a given reactor. However, other factors such as the need for high deposition rate, high wafer capacity, or small grain size sometimes make operation near the transition region (between surface reaction-rate limited and mass transport limited) desirable. In the case of operation in either the mass transport limited regime or the transition region for a given temperature and pressure, the diffusion rate of the reactant species through the boundary layer that exists between the wafer's surface and the bulk gas, and the relative local concentration of the desired species at the surface, have major impact upon the rate of reaction at the surface and hence upon the deposition rate.

In the prior art, methods to increase the velocity of the gas over the wafer surface have been employed to effectively decrease the thickness of the boundary layer and increase the relative concentration of the desired species at the surface for a given temperature, pressure and relative concentration of the desired species in the bulk gas.

For example, a batch reactor in the form of a conventional vertical furnace 10 is shown in FIG. 1. The furnace 10 includes a quartz envelope 12, heating coil 14, a wafer boat 16, a gas inlet 18 to a gas injection tube 20, and an exhaust 22. The tube 20 is constructed of high temperature material such as quartz, and has holes 24 (FIG. 2) along its length. The gas(es) is injected via the tube(s) 20 and directed toward the wafer boat holding wafers 26 resulting in an increased velocity of gas(es) across the wafers and a more uniform concentration of the desired reactant(s) in the bulk gas flow up and down the boat load. Although deposition rates can thereby be improved, this technique has its problems and limitations. Because the injection tube(s) 20 is contained within an isothermal chamber 28, the injection tube(s) 20 is at the same temperature as the wafers 26. Thus, unwanted deposition occurs on the tube(s) 20, especially at the injection holes 24. As the gas flow rate (velocity) is increased to achieve higher deposition rates, the localized velocity and pressure at the holes 24 can increase to the point where both excessive deposition at the holes 24 and excessive gas phase reaction within the chamber 28 occurs. The excessive gas phase reaction causes particles to be generated which can fall onto the wafers' surfaces causing defects. Also, the excessive deposition on the injection tube 20 flakes off and these particles can also fall onto the wafers. Thus, the maximum deposition rate which yields acceptable results on the wafers is limited.

A prior art technique of rotating a wafer 30 at high speed (500 to 1500 RPM) is illustrated in a single wafer cold wall CVD reactor 32 in FIG. 3. A gas injector 34, called a showerhead directs reactant gas 36 perpendicularly toward the spinning wafer surface, thereby thinning the boundary layer for the gas flowing radially outwardly from a stagnation point at the wafer center. Again the deposition rate does increase, but this technique also has its problems and limitations. First is the problem of holding the wafer on the susceptor while rotating at such high speeds and the complexity of design for achieving such high rates of rotation in an evacuated chamber. Second is the problem of heating the wafer uniformly while allowing for the injection of the gas perpendicular to the rotating wafer's surface which limits the maximum temperature. In addition, there is the problem of minimizing the gas turbulence to achieve the laminar type gas flow toward the wafer as required by this technique to achieve the desired uniformity. This can limit the maximum flow rate and hence the deposition rate.

In view of the above discussion, it is apparent that there is a need for an improved method and apparatus for achieving a uniform deposition rate in the process of chemical vapor deposition.

SUMMARY OF THE INVENTION

It is therefore an object of the present invention to provide an improved apparatus for chemical vapor deposition.

It is a further object of the present invention to provide an improved apparatus for applying reactant gas to a multiwafer stack.

It is a further object of the present invention to provide improved apparatus for control of the flow rate of injected and exhausted gases.

It is a still further object of the present invention to provide a heated exhaust apparatus for preventing material condensation.

It is another object of the present invention to provide removable injection and exhaust apparatus for replacement or for cleaning of material deposits.

Briefly, a preferred embodiment of the present invention includes a multiwafer chemical vapor deposition (CVD)

reactor providing improved material deposition uniformity through use of improved gas injection and exhaust apparatus. The reactor includes a wafer boat for supporting a vertical stack of wafers, spaced apart for passage of a reactant gas. A preferred embodiment of the gas injector is in the form of a vertically oriented body having at a first end a gas inlet, and extending inward from a wall of the reactor towards the wafer boat, terminating in a widened injector outlet. The injector body and outlet extend vertically a distance approximating the height of the wafer boat, and the outlet is widened to provide an improved flow of gas across the wafer. A face of the injector outlet contains a plurality of gas ejecting holes, arranged to provide a uniform supply of reactant gas over each wafer surface. The exhaust manifold is similarly configured, having a plurality of exhaust ports distributed over the height of the manifold to assist in preserving the uniform flow of reactant gas across each wafer.

IN THE DRAWING

FIG. 10A is a cross-sectional view of a gas injector having an output port in the shape of a vertical slot as described in U.S. patent application Ser. No. 08/909,461;

FIG. 10B is a front view of the gas injector of FIG. 10A;

FIG. 11A is a cross-sectional view of an injector with an output port in the shape of a vertical slot with a shutter plate;

FIG. 11B is a front view of the gas injector of FIG. 11A;

FIG. 14A is a cross-sectional view of an alternate embodiment of a gas injector;

FIG. 14B shows a gas outlet plate used on the injector of FIG. 14A;

FIG. 14C shows a view of the face of the body of the injector of FIG. 14A; and

DETAILED DESCRIPTION OF THE PREFERRED EMBODIMENT

Figure 1:
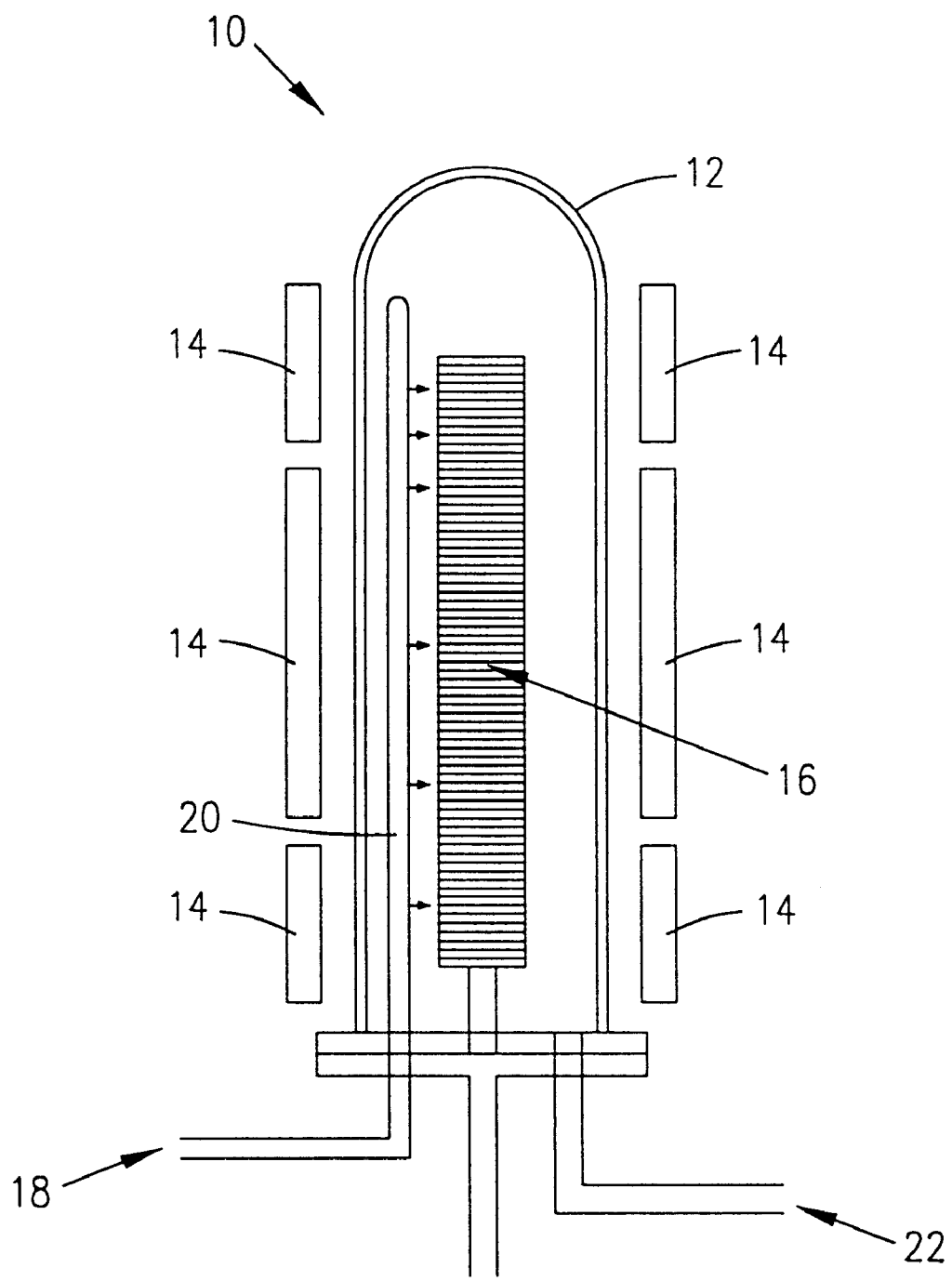
FIG. 1 shows a gas injection system in a prior art vertical furnace.
Figure 2:
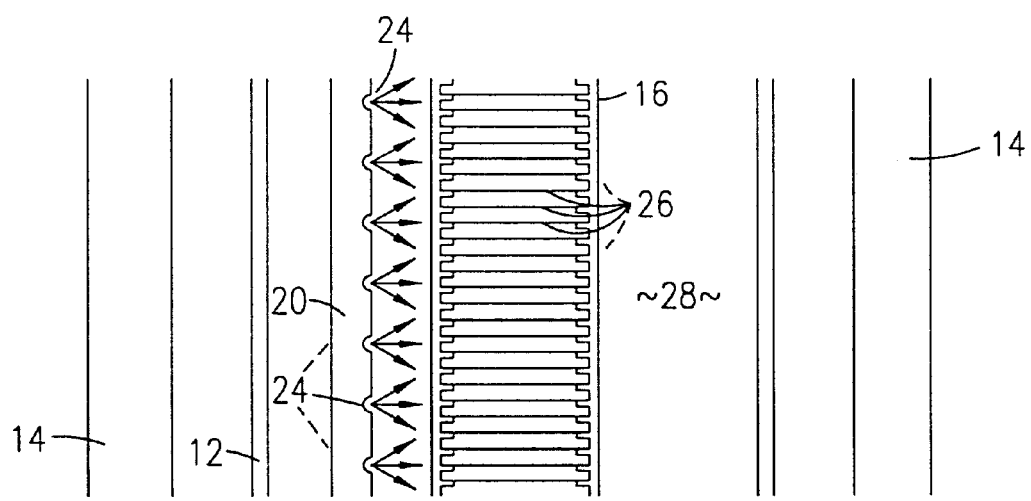
FIG. 2 is a detail view of FIG. 1.
Figure 3:
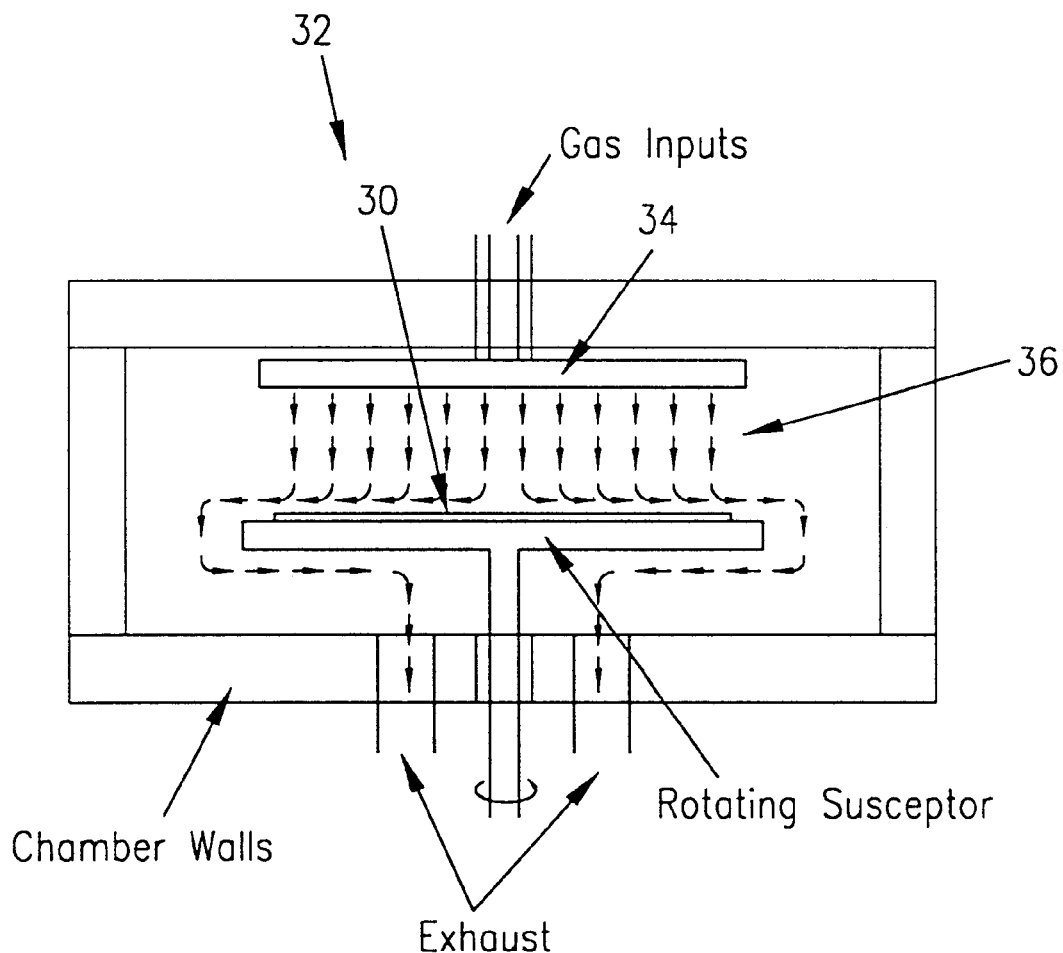
FIG. 3 illustrates a single wafer CVD reactor with a showerhead injector and rotating susceptor.
Figure 4:
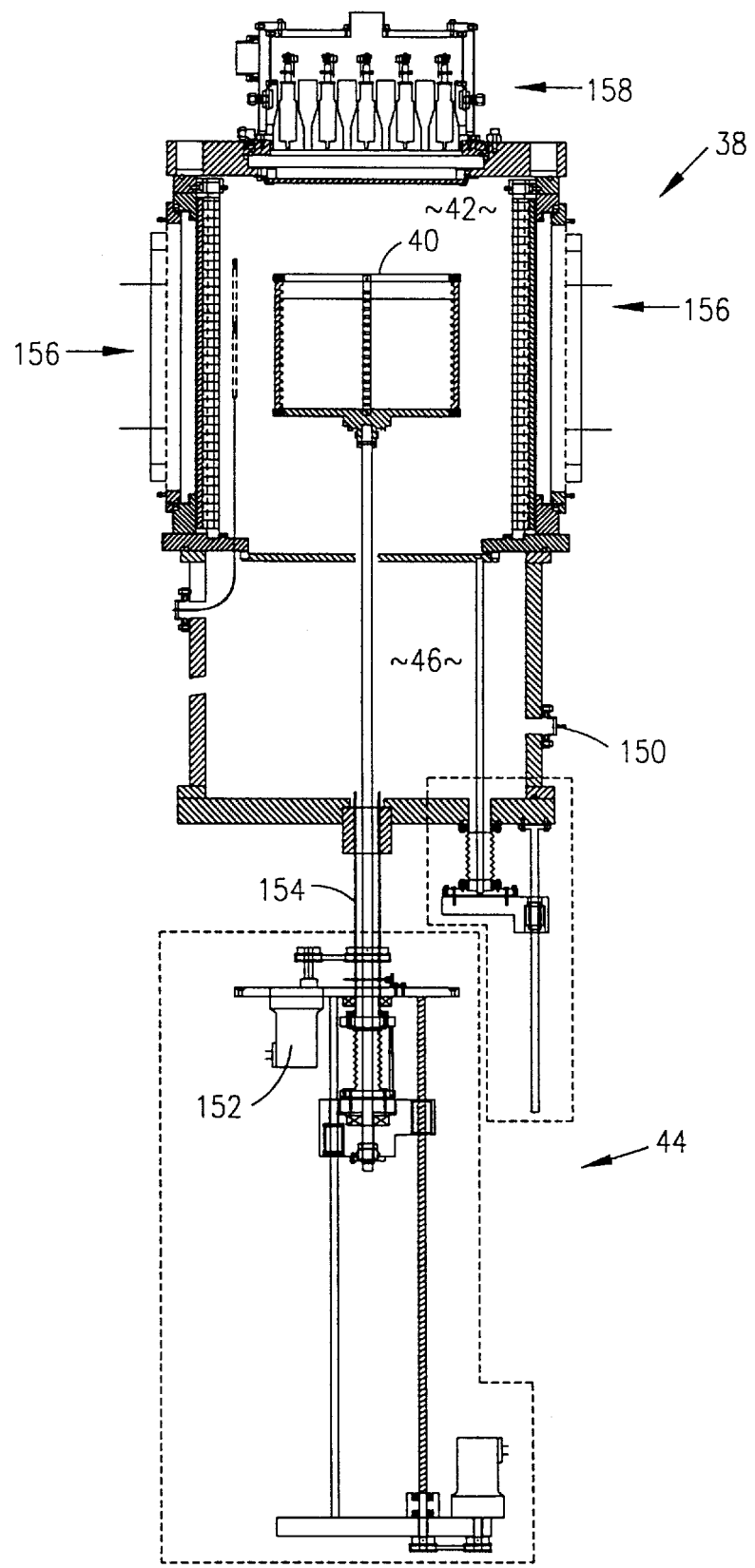
FIG. 4 shows a reactor with a dual chamber and a boat providing vertical stacking of wafers, as described in U.S. patent application Ser. No. 08/909,461.

The present invention relates to apparatus providing improved distribution of reactant gas over wafers in a multiple wafer stack, resulting in more uniform chemical vapor deposition. FIG. 4 shows a CVD reactor 38 as described in detail in U.S. patent Ser. No. 08/909,461, the content of which is incorporated herein by reference. The reactor 38 has a boat 40 for holding a plurality of wafers during processing that takes place in an upper chamber 42. For loading and unloading, the reactor includes apparatus 44 for lowering the boat 40 into a lower chamber 46.

The novel features to be described in the following detailed description also apply equally as well with the reactor described in U.S. patent application Ser. No. 09/228, 840 which is similar to the reactor of FIG. 4 except for the incorporation of RF plates in the wafer boat, apparatus for supplying RF power to the plates, and a novel apparatus for lifting the wafers from the susceptors. The details of the reactor walls and chamber described in Ser. No. 09/228,840 are the same as shown in FIG. 4 to the extent that applies for incorporation of the novel injector and exhaust system disclosed in the present application. The disclosure of U.S. patent application Ser. No. 09/228,840 is therefore incorporated herein by reference, and is to be included in combination with the novel injector and exhaust system disclosed herein as a novel and useful invention.

Figure 5:
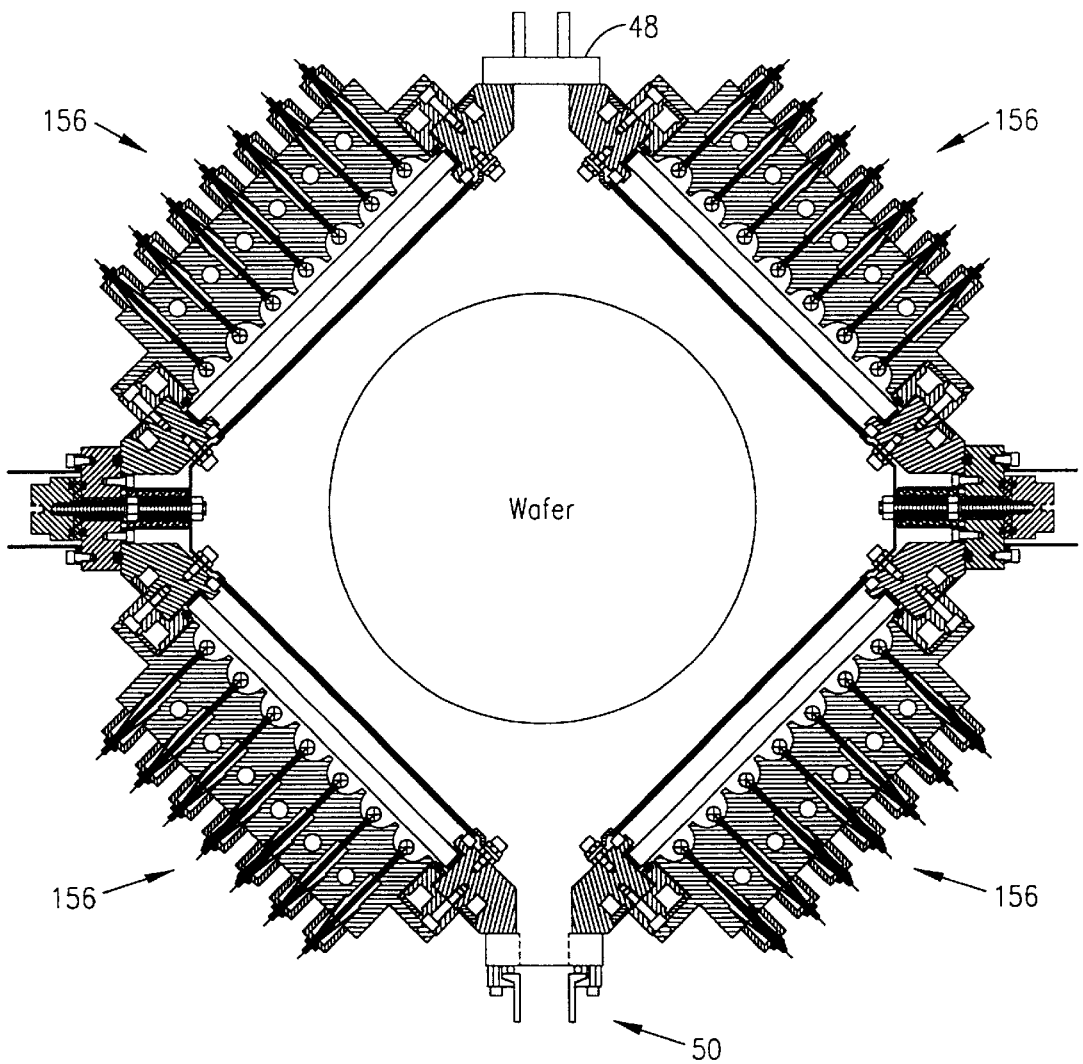
FIG. 5 is a cross-sectional view of the wafer chamber of the reactor of FIG. 4.

FIG. 5 is a cross-sectional view of the reactor 38 upper chamber, showing a gas injector 48, and a gas exhaust 50.

Figure 6:
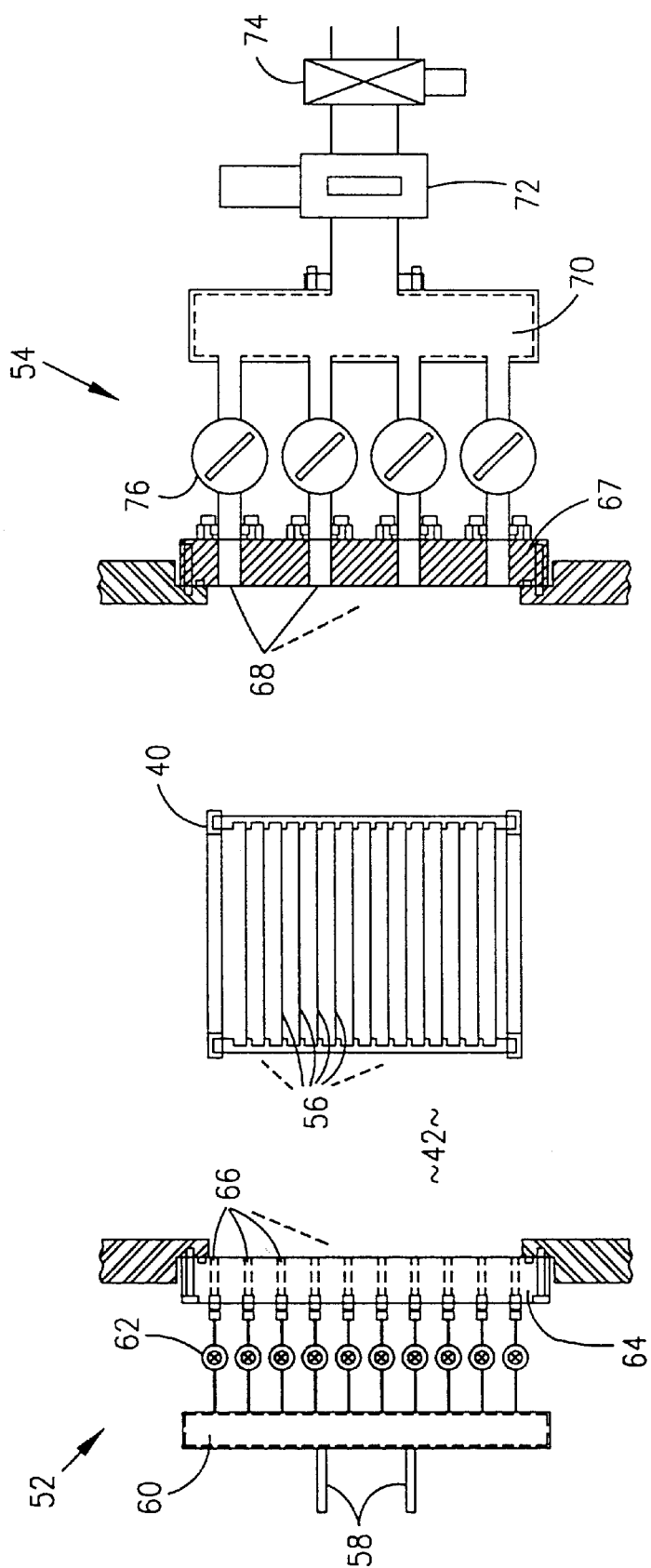
FIG. 6 shows a vertically oriented gas injector and exhaust in position to provide reactant gas to a vertical stack, and use of individual metering valves for tuning gas flow.

FIG. 6 shows a cross-sectional view of a gas injector 52 and a gas exhaust 54, arranged to illustrate their orientation and proximity to boat 40 holding a plurality of wafers 56.

The gas injector of FIG. 6 is explained in U.S. patent Ser. No. 08/909,461 included herein by reference. Process gases to be used in depositing layers on wafers 56 are provided via ducts 58 to a mixing chamber 60. The gas then continues at a rate determined in part by gas flow control devices 62 through a water-cooled injection plate 64 and out ports 66 into chamber 42 and towards wafers 56.

The exhaust manifold 54 includes an exhaust plate 67 having a plurality of exhaust ports 68, an exhaust plenum 70, a control throttle valve 72, and gate valve 74. Process gases are removed from the reaction chamber 42 through the plurality of ports 68 and are provided to exhaust plenum 70 via a plurality of associated exhaust flow control devices 76 which, in some embodiments, are similar to flow rate control devices 62. Process gases then flow through control throttle valve 72 and gate valve 74 to an external vacuum pump system (not shown). Exhaust plate 67 may be either cooled or heated via recirculating liquid or other means, depending upon the particular process employed. Note that for certain CVD processes it is desirable to heat the exhaust manifold 54 (and thus exhaust ports 68) in order to minimize condensation thereon. Flow rate control devices 62 and exhaust flow control devices 76 may be independently adjusted to allow for an optimum process gas flow pattern within the reaction chamber 42.

Figure 7:
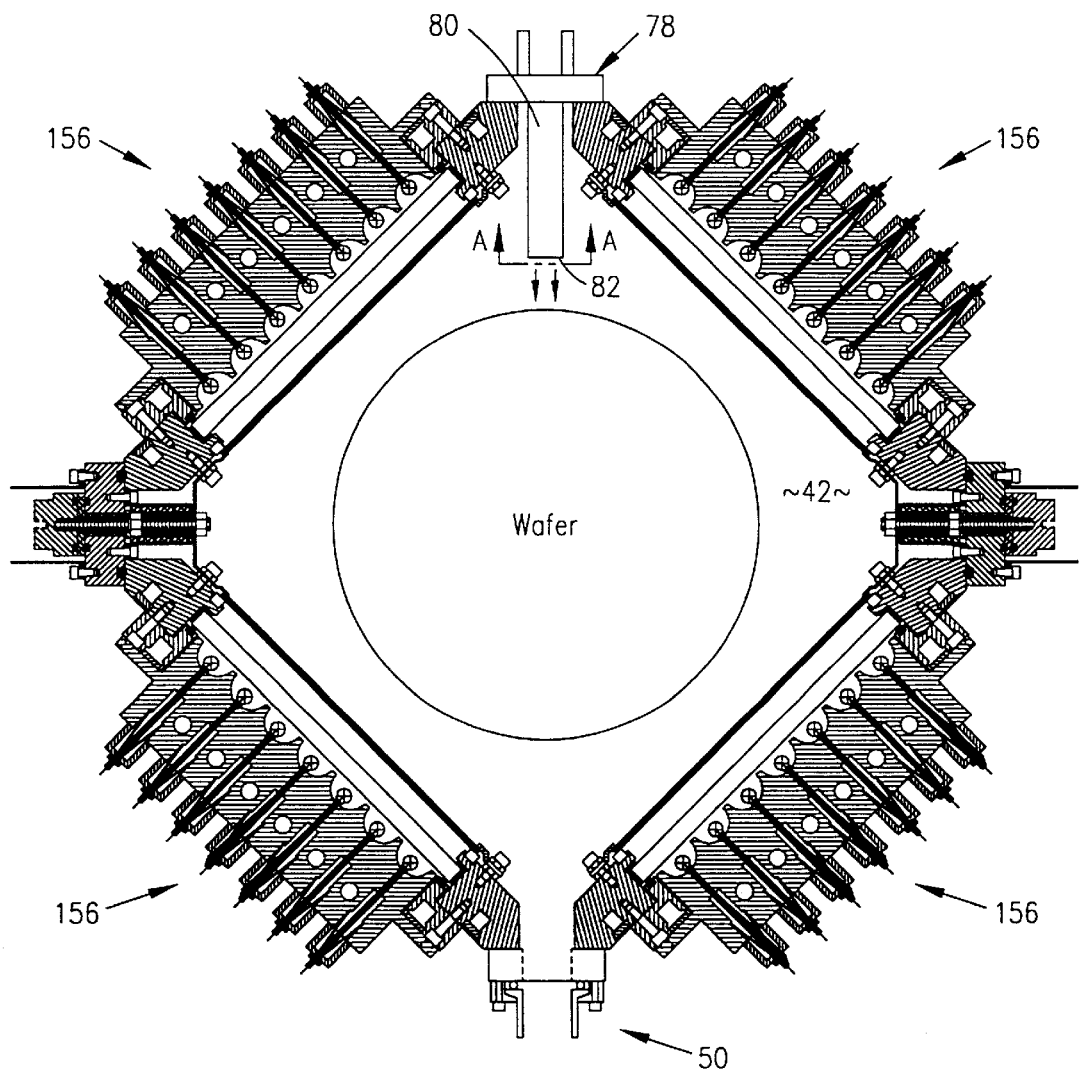
FIG. 7 is a cross-sectional view of the upper chamber of the reactor of FIG. 4 illustrating an elongated gas injector.
Figure 8A:
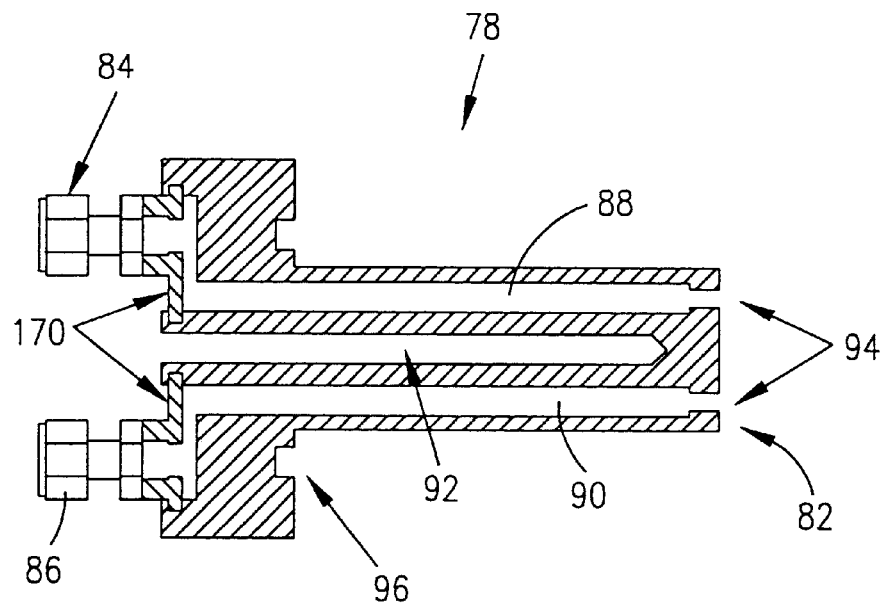
FIG. 8 shows detail of an elongated vertical injector.
Figure 8B:
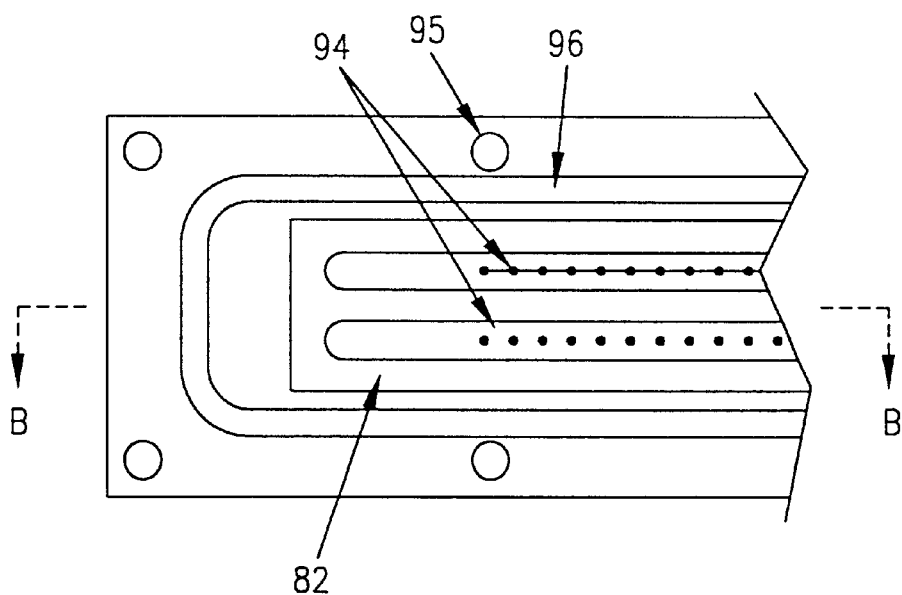

FIG. 7 illustrates a gas injector 78 having a body 80 extending into the chamber 42 so as to place the gas outlet face 82 in close proximity to the wafer boat 40 (FIG. 4) and wafers. As with the injector described in FIG. 6, injector 78 also extends vertically to provide gas flow for all of the wafers on the wafer boat. A preferred embodiment of the injector 78 is shown in a cross-sectional view A—A (refer to FIG. 7) in FIG. 8A. Two gas fittings 84, 86 are shown, providing input for reactant gas to gas channels 88, 90. A water channel 92 is shown between the channels 88, 90 for passage of water to cool the injector 78. FIG. 8B is an end view of the injector, showing the face 82. A plurality of gas outlet holes 94 are provided from each of the channels 88 and 90. FIG. 8B also clearly shows mounting holes 95 and an O-ring groove 96 for sealing the injector to a wall of the reactor.

Figure 9:
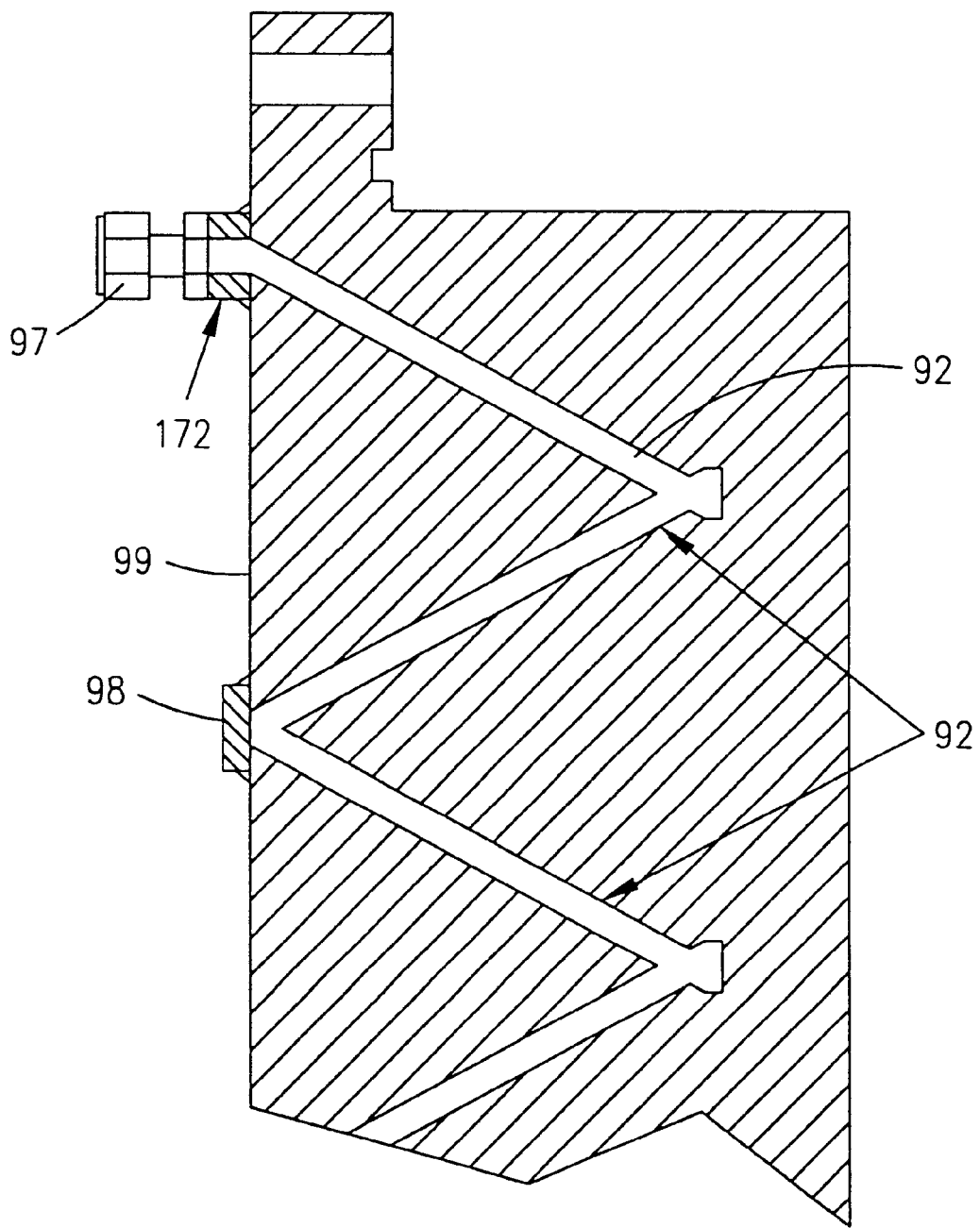
FIG. 9 shows further detail of water coolant channels in a vertical, elongated injector.

FIG. 9 is a cross-sectional view B—B (refer to FIG. 8B) of the injector 78 showing the path of the water passage holes 92. The water is supplied through a coolant fitting 97. Intersections of alternate holes 92 at the surface 99 are sealed with a plate 98.

An alternate embodiment of an injector similar to injector 52 of FIG. 6 is an injector 100 shown in FIGS. 10A and 10B. Injector 100 has gas inlets 102, providing passage to a chamber 104. The chamber 104 is attached to a flange 106 having a single elongated slot 108 providing outlet for the gas into the reactor chamber 42. The slot 108 preferably extends in length over the entire height of the wafer boat. FIG. 10B is an end view of the injector 100, and more clearly shows the slot 108, as well as flange mounting holes 110 and an O-ring groove 112.

Figure 12C:
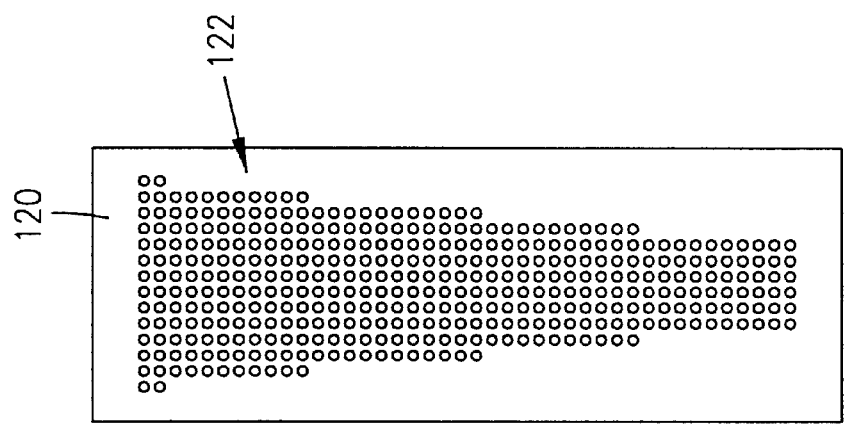
FIG. 12C is a front view of another embodiment of a gas injection plate of FIG. 12A.
Figure 12B:
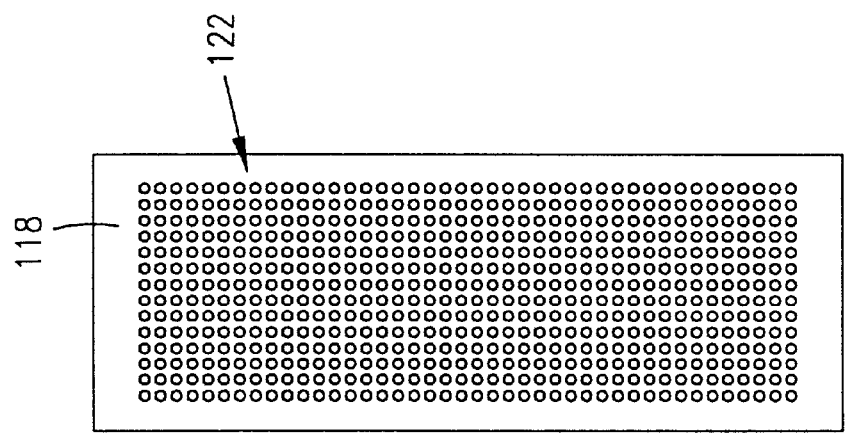
FIG. 12B is a front view of an embodiment of the gas injection plate of FIG. 12A.
Figure 12A:
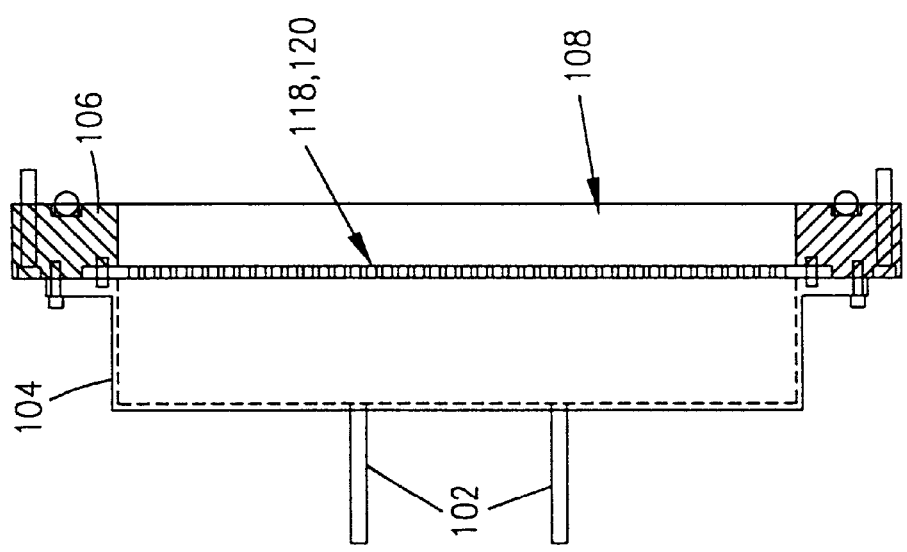
FIG. 12A is a cross-sectional view of a gas injector with output ports in the from of a plurality of holes through a plate.

FIGS. 11A and 11B illustrate a further embodiment of an injector 114, similar to the injector of FIGS. 10A and 10B. A shutter 116 is used to adjust the effective opening of slot 108 to control the rate of flow of reactant gases. In another embodiment, FIG. 12A shows the shutter plate 116 of FIGS. 11A–B replaced with either of plates 118 or 120 of FIGS. 12B and 12C respectively. Each of plates 118, 120 has a plurality of holes 122, arranged to distribute the gases as required. The plates 118, 120 are given by example. Other arrangements of holes 122 are also included in the spirit of the present invention. The plates 118, 120 can also be liquid cooled, the details of which will be apparent to those skilled in the art, such as by running water channels similar to channels 92 of FIG. 9 between holes 122.

Referring again to FIG. 6, it is apparent that the exhaust manifold requirements are similar to the injector. The similarity applies also to FIGS. 10–12, whereby the structures shown can also be applied to an exhaust manifold i.e. a plate similar to plate 116 of FIGS. 11 and 12 can be applied to the exhaust manifold.

Figure 13:
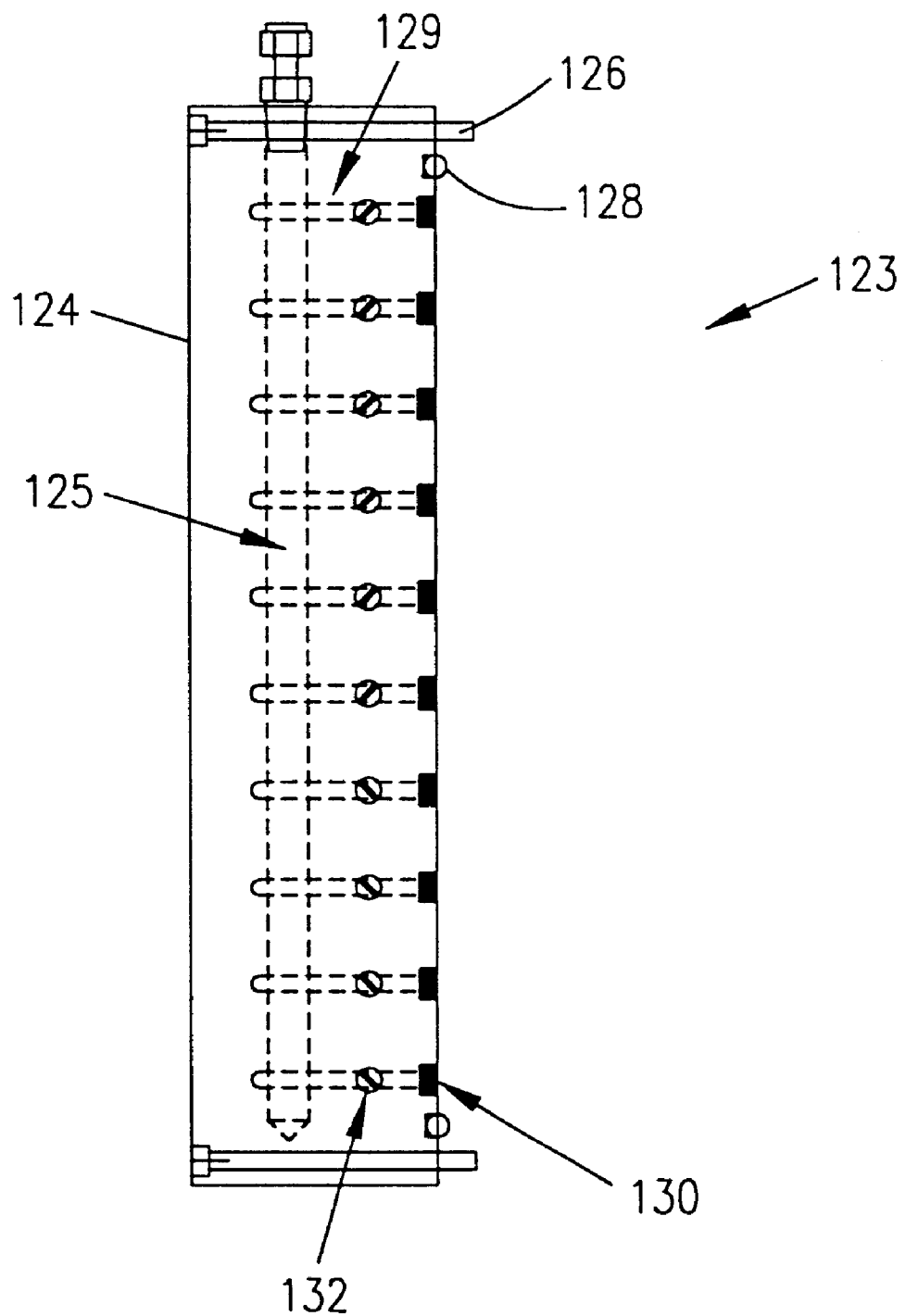
FIG. 13 is a view of still another embodiment of the gas injection system of FIG. 6.

FIG. 13 shows another embodiment 123 of an injector or exhaust manifold. The embodiment 123 replaces plate 106 of FIGS. 10–12, and the chamber 104 and inlets 102. Injector 123 is attached to the reactor in a similar manner to plate 106 of FIG. 10, with bolts 126, and sealed with an O-ring 128. An injector plate 124 may include one or more vertical gas supply shafts 125 into which are coupled a plurality of horizontal gas ducts 129. Sintered metal disks 130 may be press fitted into counterbores at an end of ducts 129 to produce a more laminar gas flow and to reduce the entry of undesirable particles into reaction chamber 42. Each of ducts 129 has provided therein a gas flow adjustment screw 132 which, by varying the cross-sectional area of ducts 129 through which process gas flows, controls the flow of reactant gas to reaction chamber 42. Screws 132 are sealed to associated ducts 129 via O-rings (not shown). Of course, a similar duct structure may be employed to control the removal of process gases from reaction chamber 42 via an exhaust manifold.

In another injector embodiment 134 shown in FIGS. 14A–C, the process gases separately enter the reaction chamber 42 and are mixed therein. An injection plate 136 has formed therein on the side facing the interior of chamber 42 a plurality (two shown) of slots 138 and 140 shown in the cross-section view A—A of FIG. 14A. An O-ring groove 139 is shown in FIG. 14A, but omitted in FIG. 14C for clarity of illustration of other features. A thinner plate 142 (FIG. 14B) having a plurality of holes 144 which line up over the slots 138 and 140 is bolted to injection plate 136. The size, number and spacing of the holes in plate 142 may be varied throughout its length in order to produce the desired gas flow pattern to achieve uniform and consistent depositions onto all of the wafers 56 in wafer boat 40. The gases enter the channels 138 and 140 via holes drilled from the exterior side into which are gas fittings 146. Hole 148 is provided and tapped on both ends to accept fittings to allow liquid to flow through injection plate 136 for cooling. During processing of one or more wafers 56, inert gas is injected into lower chamber portion 46 (FIG. 4) via a gas inlet 150 (FIG. 4) to retard process gases escaping process chamber 42 and entering lower chamber portion 46 (FIG. 4). Electric motor 152 is activated and rotates shaft 154 and wafers 56 at a desired rate such as, for instance, between approximately 3 and 30 rpms. Power provided to the independent zones of heaters including 156 and 158 and others as described in U.S. patent application Ser. No. 08/909,461 is adjusted to bring the temperature of reaction chamber 42 to a desired processing temperature, as described above. Once the temperature of wafers 56 has stabilized in a uniform manner at the desired process temperature, reactant gases are injected into reaction chamber process portion 42 of reactor 38 via gas injector 48 (FIG. 5) and are exhausted therefrom via exhaust 50, as discussed above.

Figure 15:
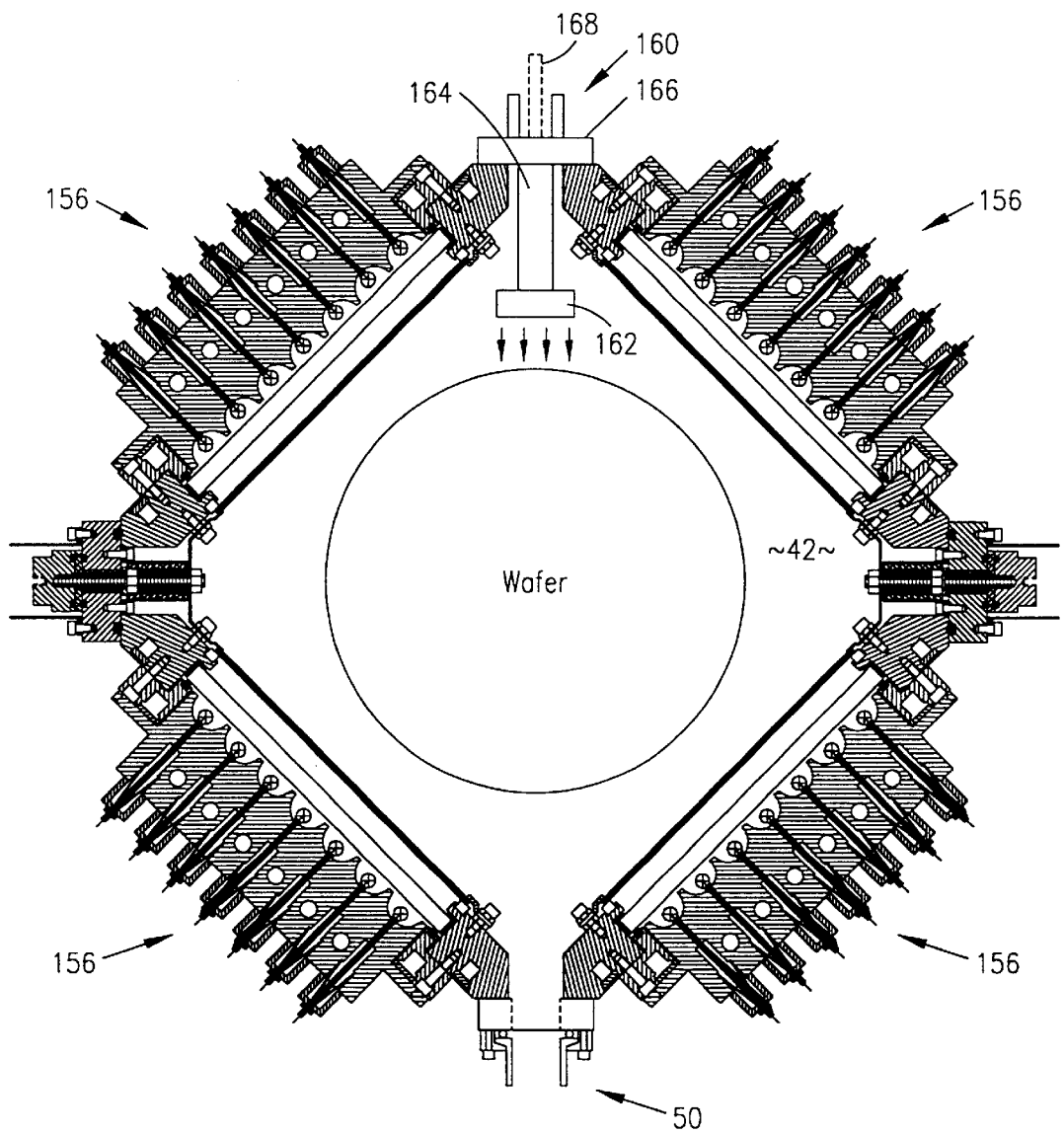
FIG. 15 shows an elongated injector with a widened gas outlet, mounted on a reactor.

A still further embodiment of the injector of the present invention is shown in FIG. 15. The injector 160 is elongated in the vertical direction similar to the injector described above. In addition, injector 160 has a widened outlet 162 to more uniformly supply reactant gas over the wafer surfaces. The widened outlet can be bolted onto the injector body 164 from the inside of the chamber, or the widened outlet 162 and the elongated body 164 can be fashioned from a single piece of material and O-ring sealed to the injector's mounting plate 166. Additionally, liquid cooling inlet and outlet pipes 168 can protrude through holes in the mounting plate for more efficient cooling of the widened face. If necessary, the two side heater lamps 156 that face toward the widened injector can be removed or disconnected to reduce heat transfer to the injector 160.

The features and advantages of the present invention will now be presented in further detail. The apparatus described above, results in improved uniformity of material deposition, an advantage not only in deposition processes such as CVD and PECVD, but also in etching processes and other processes where gases must efficiently be brought to the wafer surface and/or efficiently removed from a surface, such as annealing and degassing processes and other heat treating processes. For convenience, the following will refer to CVD and/or PECVD processes with the understanding that the features of the present invention would apply to reactive ion etching, photo-resist ashing and other processes as well. In addition to the enhanced CVD and PECVD deposition rates, other advantages of the present invention include smoother surface texture of deposited films, enhanced conformity of the films over the device structures at lower pressures and at the higher deposition rates, enhanced film purity via reduced concentration of unwanted impurities, and reduction of contaminating particles generated that end up on the wafer surface.

The greatly accelerated deposition rates realized with the present invention are a result of a number of factors influenced by the ability to inject the reactant gas(es) at very high velocities without the above mentioned deleterious side effects found in the prior art. First, the high velocity gas stream passing across the wafer has the effect of thinning the boundary layer, resulting in faster delivery of the desired reactant(s) to the surface. Second, the very high gas flow provides an enhanced source of fresh gas with highest concentration(s) of the desired species of reactant to the wafer's surface. Third, this high velocity flow of the gas(es) results in a very low residence time of the gas in the area of interest (that is, over the wafer surface) which sweeps out unwanted reaction by-products, resulting in a further increase in the relative concentration of the desired species. All these factors contribute to enhanced deposition rates. As a result, deposition rates on the order of 10 to 50 times faster than the prior art are realized.

The very high rates of deposition enabled by the present invention at relatively low overall chamber pressures (e.g. 3,000 Angstroms/minute for polysilicon at 250 millitorr at typical process temperatures) moves the reaction into the regime where the deposition rate exceeds the crystallization rate. CVD depositions of, for example, polysilicon, in this regime can result in a much smoother surface, caused by the deposited film having a two layered structure with amorphous silicon at the top. It is well known in the art that for the CVD deposition of silicon at a given pressure, there is a transition temperature above which a polycrystalline structure develops in each layer as that layer is deposited, and the atoms are unlikely to continue rearranging after they have been covered by other silicon atoms. However, in films deposited slightly below the transition temperature, each layer of the film can be deposited in an amorphous form and crystallize during continued deposition because of the lower energy of the polycrystalline structure. Nucleation of crystallites is most likely to occur by heterogeneous nucleation at the lower silicon-silicon dioxide interface. Crystallization of the amorphous silicon then continues on these initial nuclei, with the crystalline region propagating upward into the film by solid-phase epitaxial growth. When the crystallization rate is less than the deposition rate, only the lower portion of the film crystallizes during deposition, although the crystallization continues during the heat cycle after the deposition itself is terminated by stopping the silane flow. Thus, the film can be crystalline near the bottom and amorphous near the top, resulting in a very smooth surface texture.

Since very high deposition rates can be realized at very low pressures, it has the effect of enhancing the deposited films' conformality over a wafer's topography. This is a result of the ability to provide a higher concentration of the desired reactant(s) on all surfaces of the wafer including sidewalls and bottoms of vias. The accelerated deposition rate achievable via this invention at reduced pressures results in an effective increase of the mean free path in the gas phase, which allows more penetration of the reactant to the bottom and along the walls of device features. The very low gas residence times achieved via this invention and the resultant sweeping of unwanted reaction by products (e.g. hydrogen) out of the gas phase has the effect of increasing the diffusion of the desired silicon producing species in both the gas phase and on the surface which enhances the deposited films while, at the same time, providing more absorption sites available for the desired silicon producing species such as $SiH_4$ and $SiH_2$ since less of the absorption sites are occupied by the unwanted by-products, thereby increasing the rate of deposition on all surfaces. SEM photomicrographs of polysilicon depositions (2,000 angstroms per minute a 250 milli-torr and 650 C.) in the single wafer chamber of this invention into 0.25 micron vias exhibit very uniform thickness conforming to the vias' walls and bottom without cusping at the top edges of the vias.

In addition, the CVD films produced with the present invention are of higher quality in terms of a reduced incorporation of unwanted impurities within the film. All CVD reactors have some level of impurity molecules, such as water vapor, oxygen, nitrogen, etc., within the chamber. This is particularly true of cold wall reactors for impurities such as $H_2O$ (moisture) and others which tend to adhere to the cooled chamber walls and are released from the walls when the chamber is evacuated and when the interior surface of the walls are warmed from the heat of the wafer, the susceptor, and other heated surfaces within the chamber's interior. Although the levels of such unwanted molecules can be reduced through heating of the chamber's walls to elevated temperatures (above 100 C.) while evacuating the chamber with turbo or cryo pumps to very low pressures on the order of 10E-6 to 10E-7 Torr while alternating such evacuation cycles with high flow purge cycles of impurity free inert gas such as nitrogen, these procedures are costly, time consuming, and there still remains some level of such unwanted impurities. The amount of incorporation of unwanted impurities in CVD films is proportional to the partial pressure of such impurity molecules, the rate of reaction or entrapment of the impurities as the desired film is deposited, and the deposition time. The reduction of impurities in the films produced with the present invention is due to (a) the reduced partial pressure of the impurities in the gas stream above the wafer's surface resulting from the increased concentration of the desired reactant species in the gas stream, (b) the enhanced rate of removal of the unwanted impurities due to the very high gas velocities and resultant low residence time, and (c) the greatly reduced process time resulting from the high deposition rates that are achieved.

In addition to supplying an enhanced concentration of the desired reactant(s) to the surface and the accelerated sweeping away of unwanted reaction by-products and impurity molecules, this very high velocity gas flowing generally in parallel to the surface is believed to be, in part, responsible for the low quantity of particles on the wafers processed in this fashion.

The multilayer reactor of FIG. 4 provides the ability to process one or more wafers at a time and a method of heating the wafers uniformly in a cold wall chamber to minimize wall deposits for ease of cleaning (e.g. via plasma enhanced reaction of $NF_3$, other such etchant gases, or via the injection of etchant gases such as HCl at high temperatures without plasma). The elongated injectors described above provide the advantage of positioning of a temperature controlled gas injector at relatively close proximity to the subject wafers within the chamber to produce the desired and controlled localized high velocity gas flow. The reactor also has the ability to rotate the wafers while the gas is being swept into the chamber on one side and exhausted out the other side, which causes a near mono-directional flow which, without rotation, would result in a very non-uniform deposition across the surface topography of the wafers. The reactor disclosed herein also has the ability to induce a very uniform plasma (glow discharge) in close proximity to the wafers' surfaces for PECVD processing. See the U.S. patent application Ser. No. 09/228,840 titled "Vertical Plasma Enhanced Process Apparatus and Method", the disclosure of which is incorporated herein by reference. The reactor has the capability to deposit CVD films on one side of a wafer and not the other, and the ability to exclude edge deposition around the periphery of the wafer, which is desired for certain films such as tungsten, and the ability to load and unload wafers via robotics permitting automatic operation and the capability for clustering one or more such chambers around a central transfer chamber or enhanced process control, higher throughputs, the minimization of particles and the capability for sequential processing.

Referring again to FIG. 5, the gas(es) is injected toward the wafers via a temperature controlled injection plate which bolts onto and is vacuum sealed to one of the shorter width sides of the eight sided chamber. The injection plate may be elongated within the chamber in the direction toward the wafers as shown in FIGS. 7 and 15.

FIG. 8 shows an injector design 78 which allows for the elongation of the injector toward the wafers such that the outlet face 82 of the injector 78 can be held in close proximity to the wafers while at the same time permitting the flow of liquid through passages 92 in the injector 78 to maintain the injector at a uniform and constant temperature. Usually, for gaseous sources such as silane, it is desired to maintain the injector 78 at a low temperature (typically 25 to 100 C.) while the wafers are maintained at a temperature in excess of 600 C. for the deposition of polysilicon. This reduced injector temperature prevents the deposition along the outlet face 82 and at the outlets 94 of the injector. For CVD depositions using a vaporized liquid precursor (such as TEOS), the temperature of the injector can be maintained at higher temperatures (e.g. 100 C. or above) to prevent the condensation of the vapor in and on the injector 78 while still preventing the deposition on the injector 78 or at its outlets 94. FIG. 8 shows such an injector which allows for the separation of gases to preclude premature reaction of, for example, oxidizers and reducers before they enter the reaction chamber 42 (FIG. 4). In this case, gas channels 88, 90 are milled from the atmospheric side of the injector toward the outlet face 82. A series of holes 94 are drilled from the outlet face 82 through to the milled channels 88, 90 (in this depiction, the hole spacing is shown to differ for the two channels which may be desired for some processes). Plates 170 are welded to the input side of the injector 78 for gas tight sealing of the channels 88, 90 and are tapped to accept gas fittings 84, 86. To provide the flow of temperature controlled liquid through the injector, holes 92 are drilled at angles such that they intersect to form a continuous passage as more clearly shown in FIG. 9. Bosses 172 are welded at the ends of the uppermost and bottom most holes and tapped to accept fluid fittings 97. Cover plates 98 are welded over the outside intersecting ends of the holes 92 to produce the leak tight passage way.

The alternative high velocity gas injector designs described in the various figures are adaptable to the reactor of FIG. 4 and described in U.S. patent application Ser. No. 08/909,461, and can be such that the quantity of gas(es) flowing out of the injector's face can be varied along the vertical axis (up and down the load of wafers 56) to overcome any non-symmetrical gas flow dynamics in the vicinity of the upper and lower regions of the batch of wafers to achieve desired velocities and concentration of reactant(s) above the surfaces of the individual wafers in the load for uniform process results on the individual wafers. To achieve this, the alternate designs can include (a) a variation of the outlet hole size along the vertical axis of the injector's outlet face, for example, holes 94 in FIG. 8 and holes 122 in FIG. 12; (b) a variation of the spacing of the outlet holes drilled into the axis of the outlet face; (c) the use of a multitude of individual holes drilled into the injector from the outside to provide the variation of gas flow along the vertical axis via the use of individual metering valves 62 or mass flow controllers as shown in FIG. 6; or (d) a variation of the type of tunable injector of U.S. Pat. No. 5,551,985 where the flow from each outlet can be adjusted and/or the injection angle from each outlet can be adjusted along the vertical axis. The use of the tunable injectors described in U.S. Pat. No. 5,551,985 in the injector of the present invention for providing reactant gas in a vertical wafer stack is a novel application. The details disclosed in U.S. Pat. No. 5,551,985 are included in the present application by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A reactor for deposition of a film on a surface of each of a plurality of wafers, said reactor comprising:
    (a) a first chamber having an interior for placement of a wafer boat for processing a plurality of wafers, said chamber further including
        (i) a chamber wall leaving a window for transmission of radiant heat energy from the exterior of said chamber through said window to said interior for heating said plurality of wafers;
        (ii) a plurality of thermal plates with gaps interposed between said plates, at least one of said plates positioned between said window and said interior for diffusing said heat energy for heating said wafers on said boat;
    (b) radiant heater apparatus positioned exterior of said first chamber for radiating said heat energy trough said window to said interior for heating said thermal plate;
    (c) positioning apparatus for positioning said wafer boat in said first chamber interior, said boat having a boat height and configured for holding each of said plurality of wafers horizontally in a vertical stack arrangement;
    (d) rotation apparatus for rotating said wafer boat;
    (e) injector apparatus located in a gap between said thermal plates whereby the heat load on the injector apparatus is reduced, said injector apparatus having an elongated injector outlet for injecting a reactant gas in a direction parallel to each said wafer upon which said film is to be deposited; and
    (f) an elongated exhaust nozzle apparatus positioned opposite said boat from said injector apparatus for exhausting said reactant gas from said chamber.

2. A reactor as recited in claim 1 wherein said injector apparatus further includes a plate for covering a portion of said elongated injector outlet to control the flow of gas.

3. A reactor as recited in claim 1 wherein said injector apparatus includes a plate for covering said elongated outlet, said plate apparatus having a plurality of holes for flow of gas.

4. A reactor as recited in claim 1 wherein said injector apparatus further includes
    (a) a mixing chamber for supplying a mixture of gasses to said injector outlet; and
    (b) a plurality of gas inlets for supplying a plurality of gasses to said mixing chamber.

5. A reactor as recited in claim 2 wherein said injector apparatus further includes
    (a) a mixing chamber for supplying a mixture of gasses to said outlet; and
    (b) a plurality of gas inlets for supplying a plurality of gases to said mixing chamber.

6. A reactor as recited in claim 3 wherein said injector apparatus further includes
    (a) a mixing chamber for supplying a mixture of gasses to said injector outlet; and (b) a plurality of gas inlets for supplying a plurality of gases to said mixing chamber.

7. A reactor for deposition of a film on a surface of each of a plurality of wafers, said reactor comprising:
   (a) a first chamber having an interior for placement of a wafer boat for processing a plurality of wafers placed thereon, said chamber further including
      (i) a chamber wall having a window for transmission of radiant heat energy from the exterior of said chamber through said window to said wafer boat for heating a plurality of wafers;
      (ii) a plurality of thermal plates with gaps interposed between said plates, at least one of said plates positioned between said window and said boat for diffusing said heat energy for heating sad wafers on said boat;
   (b) a radiant heater positioned exterior to said first chamber for radiating said heat energy through said window to said interior for heating said thermal plate;
   (c) a wafer boat for holding a plurality of horizontally oriented wafers in a vertical stack, said boat including a plurality of RF plates and a plurality of susceptors, wherein each wafer is positioned horizontally on a susceptor and beneath an RF plate;
   (d) apparatus for transmitting RF energy to said RF plates;
   (e) positioning apparatus for positioning said wafer boat in said first chamber interior;
   (f) rotation apparatus for rotating said wafer boat;
   (g) injector apparatus located in a gap between said thermal plates whereby the heat load on the injector apparatus is reduced, said injector apparatus having an elongated injector outlet extending along substantially all of the height of said boat, for injecting reactant gas across each of said wafers; and
   h) an elongated exhaust nozzle extending along substantially all of the height of said boat and positioned on an opposite side of said boat from said injector apparatus, for exhausting said reactant gas from said first chamber.

8. A reactor is recited in claim 7 further comprising
   (a) a second chamber adjacent to the first chamber;
   (b) means for isolating the first chamber from the second chamber;
   (c) a drive for moving the wafer boat between the first and second chambers;
   (d) a lift mechanism in the second chamber for lifting the wafers onto and off of the susceptors; and
   (e) a robotic arm for loading and unloading the wafers.

9. A reactor as recited in claim 7 wherein said injector outlet includes a plurality of gas outlet openings distributed over its length.

10. A reactor as recited in claim 7 wherein said injector apparatus includes
    (a) a first plurality of gas outlet holes for injecting a first gas into said chamber; and
    (b) a second plurality of gas outlet holes for injecting a second gas into said chamber.

11. A reactor as recited in claim 10 wherein said injector apparatus further includes an injector body and liquid cooling apparatus for passing liquid through said body.

12. A reactor as recited in claim 7 wherein said injector apparatus includes
    (a) an injector body portion extending from said wall to a distal end towards said boat; and
    (b) a widened outlet attached to said distal end of said body.

* * * * *